United States Patent [19]
Todd

[11] Patent Number: 5,550,541
[45] Date of Patent: Aug. 27, 1996

[54] COMPACT SOURCE CODING TABLES FOR ENCODER/DECODER SYSTEM

[75] Inventor: Craig C. Todd, Mill Valley, Calif.

[73] Assignee: Dolby Laboratories Licensing Corporation, San Francisco, Calif.

[21] Appl. No.: 234,871

[22] Filed: Apr. 1, 1994

[51] Int. Cl.$^6$ .................................................. H03M 7/40
[52] U.S. Cl. ........................................ 341/51; 341/65
[58] Field of Search ............................ 341/51, 65, 106

[56] References Cited

U.S. PATENT DOCUMENTS

| | | | |
|---|---|---|---|
| 4,486,784 | 12/1984 | Abraham et al. | 358/261 |
| 4,646,148 | 2/1987 | Lienard et al. | 358/135 |
| 5,227,789 | 7/1993 | Barry et al. | 341/65 |
| 5,325,091 | 6/1994 | Kaplan et al. | 341/51 |

OTHER PUBLICATIONS

Hamilton, et al., "Digramatic Text Compression", IBM Technical Disclosure Bulletin, vol. 23, No. 2, Jul. 1980, pp. 448–452.

"ASPEC", ISO/IEC JTC1/SC2/WG11, 1989.

Bell, Cleary and Witten, "Text Compression", 1990, pp. 100–107.

"Coding of Moving Pictures and Associated Audio...", CD 11172-3, ISO/IEC JTCI/SC29, 1992, pp. 2–36, A–1 to B–21 and C–15 to C–33.

*Primary Examiner*—Marc S. Hoff
*Attorney, Agent, or Firm*—Thomas A. Gallagher; David N. Lathrop

[57] ABSTRACT

An apparatus or method which applies data compression techniques such as multi-dimensional Huffman encoding uses compact encoding tables which are smaller than conventional tables by ordering symbols within messages prior to coding and passing order information with the resulting code word. An apparatus or method which applies data decompression recovers a message from a compact decoding table in response to a code word and reorders symbols within the message according to order information received with the code word.

22 Claims, 5 Drawing Sheets

COMPACT SOURCE CODING TABLES FOR ENCODER/DECODER SYSTEM

TECHNICAL FIELD

The invention relates in general to various source coding techniques which use a table or a matrix to encode and decode information. More particularly, the invention relates to encoding/decoding systems which require less space to store tables for coding techniques such as Huffman coding.

BACKGROUND

There is a growing use of data compression techniques in data storage and communication systems because data compression can minimize the amount of storage space or transmission bandwidth required to convey information.

Data compressed by a "lossy" technique cannot be recovered perfectly by any decompression technique because some information is lost during compression, but data compressed by a "lossless" technique can be recovered perfectly. Quantization is one well known example of a lossy technique. Run-length encoding (RLE) is a well known example of a lossless technique. In some audio and video applications, systems often use both lossy and lossless compression techniques.

Some "perceptual coders" of signals intended for human perception attempt to apply lossy compression techniques according to psycho-perceptual principles such that the effects of the compression loss is imperceptible. Generally the amount of loss increases with higher levels of lossy compression; therefore, there are limits to how much lossy compression can be applied before the subjective quality of the resultant signal is degraded. Some perceptual coders also apply lossless techniques in addition to lossy techniques to achieve further compression without incurring perceivable degradation.

A perceptual coding standard which includes the application of lossless compression to quantized information is described in the ISO/MPEG standards document "Coding of Moving Pictures and Associated Audio for Digital Storage Media at up to about 1.5 Mbit/s-CD 11172-3 (Part 3 Audio)," ISO/IEC JTC1/SC29, 1992, which is incorporated herein by reference in its entirety. An example of a transform coder which applies Huffman coding, a lossless compression technique, to quantized transform coefficients is described in U.S. Pat. No. 5,285,498 which is incorporated herein by reference in its entirety.

Huffman coding is a well known lossless compression technique. Various implementations of Huffman coding frequently use one or more tables or matrices. During compression, one or more data symbols to be compressed are used as keys into an appropriate encoding table; the encoding table provides the appropriate variable-length code word. During decompression, the variable-length code word is used to traverse a tree-like structure stored in one or more decoding tables to establish the original value of the compressed symbols. In many practical embodiments, the encoding and decoding tables are stored in Read Only Memory (ROM) or in Random Access Memory (RAM). Unfortunately, these coding tables are generally very large and require considerable memory, thereby increasing implementation costs. It is desirable to minimize the amount of memory required to store and use coding tables.

DISCLOSURE OF INVENTION

It is an object of the present invention to provide for compact coding tables which may be stored in less space than conventional coding tables for use with data compression and data decompression without any significant penalty in compression performance.

According to the teachings of the present invention incorporated into one embodiment of an encoder, order information is generated which represents the order of symbols in a pair of symbols with respect to a specific order, an encoding table is consulted to generate a code word in response to the pair of symbols ordered according to the specific order, and the code word and order information is assembled into a form suitable for subsequent processing, transmission or storage.

According to the teachings of the present invention incorporated into one embodiment of a decoder, a code word and order information are extracted from a coded signal, a decoding table is consulted to generate an ordered pair of symbols in response to the code word, and the pair of symbols are reordered as required in response to the order information.

Many alternatives are possible. For example, symbols may be grouped into ordered sets comprising more than two symbols, and the symbols may be reordered within the sets according to essentially any order.

The present invention may be implemented in many different embodiments and incorporated into a wide variety of encoders and decoders. Throughout this discussion, more particular mention is made of audio coding applications; however, it should be understood that the present invention may be used in a broad range of applications such as, for example, information storage and retrieval. The various features of the present invention and its preferred embodiments may be better understood by referring to the following discussion and the accompanying drawings. The contents of the following discussion and the drawings are set forth as examples only and should not be understood to represent limitations upon the scope of the present invention.

MODES FOR CARRYING OUT THE INVENTION

Figure 1:
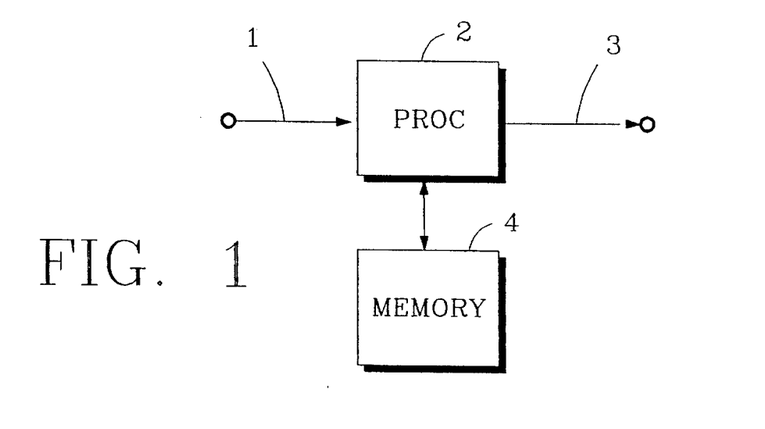
FIG. 1 illustrates a basic block diagram of an information processing system.

FIG. 1 illustrates an information processing system which may incorporate the present invention. In one embodiment, processor 2 receives from path 1 an input signal conveying information, applies data compression techniques to the signal, and passes along path 3 a coded signal representing the results of the compression. Memory 4 stores one or more encoding tables used by processor 2 while performing data compression.

In a second embodiment, processor 2 receives from path 1 a coded signal comprising compressed data, applies data decompression techniques to the signal, and passes along path 3 an output signal representing the results of the decompression. Memory 4 stores one or more decoding tables used by processor 2 while performing data decompression.

The specific implementation and architecture of the processing system is not critical to the practice of the present invention. For example, processor 2 may be implemented by a processor executing software stored in memory 4, or it may be implemented by application-specific hardware. Memory 4 may comprise any desired combination of Read Only Memory (ROM) and read/write memory such as Random Access Memory (RAM). Processor 2 and memory 4 may be implemented by a single component such as a micro-computer integrated circuit.

Figure 2A:
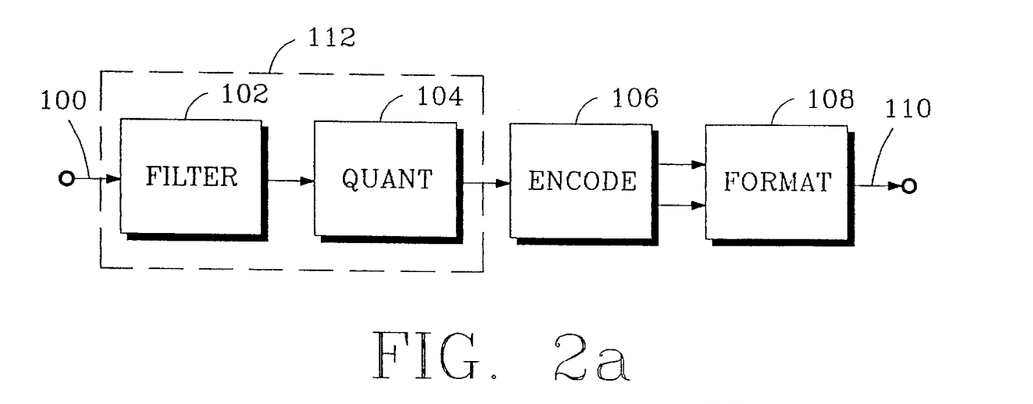
FIGS. 2a and 2b illustrate functional block diagrams of a split-band signal analysis/synthesis system.

FIGS. 2a and 2b illustrate a few features of a split-band signal analysis/synthesis system suitable for incorporating various aspects of the present invention. Referring to FIG. 2a, analysis filter 102 generates spectral signals in response to an input signal received from path 100, quantizer 104 quantizes the spectral signals, compressor 106 applies lossless compression to the quantized signals, and formatter 108 assembles the compressed signals into an encoded signal having a form suitable for subsequent processing, transmission or storage, and passes the encoded signal along path 110. In perceptual coding systems, quantizer 104 adapts its quantization in response to a perceptual model.

Figure 2B:
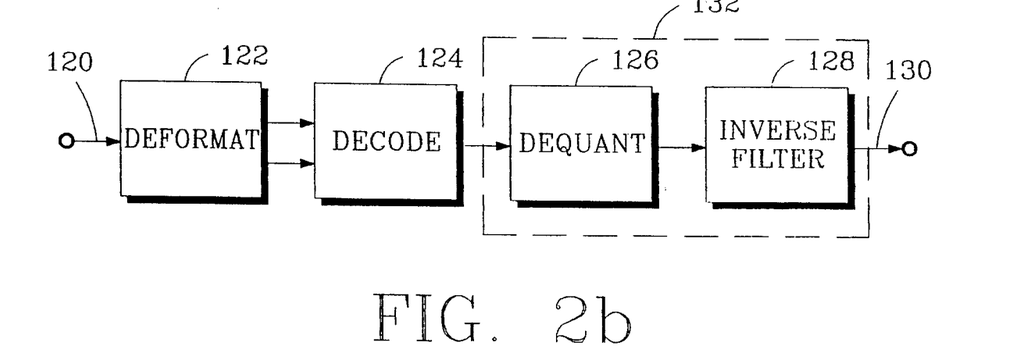

Referring to FIG. 2b, deformatter 122 extracts compressed spectral signals from an encoded signal which it receives from path 120, decompressor 124 reverses the effects of lossless compression by decompressing the compressed spectral signals, dequantizer 126 dequantizes the decompressed spectral signals, and inverse filter 128 generates an output signal along path 130 in response to the dequantized spectral signals.

Many details of implementation for a split-band analysis/synthesis system which are not important to the practice of the present invention are not discussed here. For additional information, see U.S. Pat. No. 5,109,417, incorporated herein by reference in its entirety.

The present invention is not limited to signal analysis/synthesis applications, nor is it limited to applications which apply lossy forms of data compression. For example, the present invention may be incorporated into computer disk storage systems. The components within region 122 shown in FIG. 2a should be understood to represent one example of a source of data to be compressed. Similarly, the components within region 132 shown in FIG. 2b should be understood to represent one example of a destination or use for decompressed data.

Structures of Several Embodiments

Figure 3A:
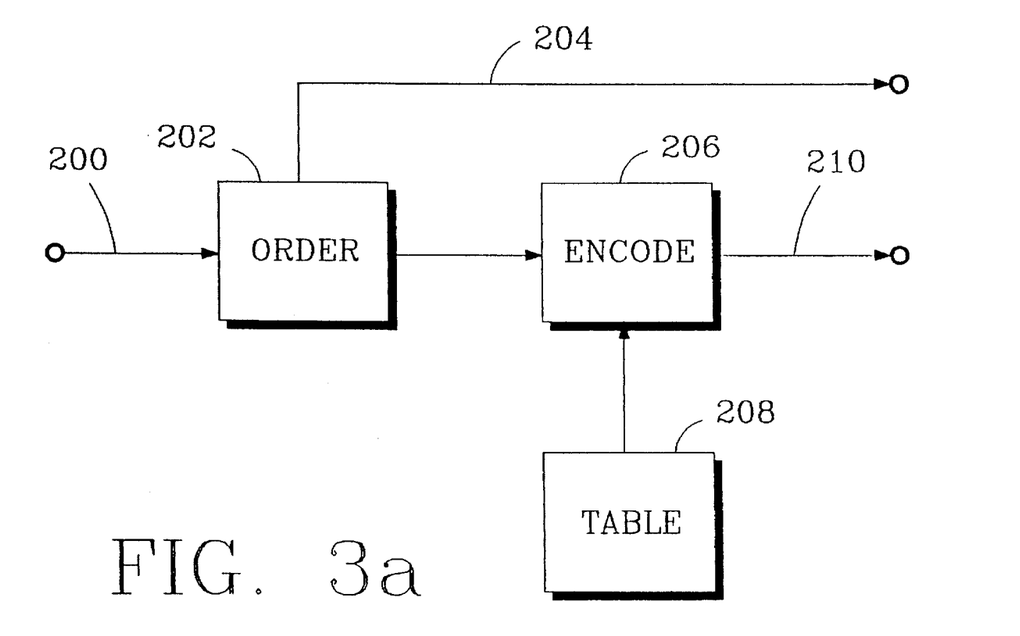
FIGS. 3a and 3b illustrate functional block diagrams of a compressor and a decompressor.

The block diagram shown in FIG. 3a provides additional detail for one embodiment of compressor 106. A plurality of symbols are received from path 200. Order 202 generates along path 204 information regarding the order of the plurality of symbols with respect to a specific order, reorders the symbols as necessary to conform to the specific order and passes the ordered symbols to encoder 206. Encoder 206 consults table 308 and generates a code word along path 210 in response to the ordered symbols.

In an alternative embodiment, order 202 generates information regarding the order of the plurality of symbols with respect to a specific order but does not reorder the symbols. Instead, the order information is passed to encoder 206, possibly along a path not shown in the figure. Encoder 206 generates a code word in response to the symbols and the order information.

In digital systems, numerical orders are generally convenient choices for a specific order because information is represented numerically. For example, non-numeric information such as alphabetic and punctuation symbols may be represented by symbols having numerical values according to the American Standard Code for Information Interchange (ASCII). Numerical information, although inherently quantitative, may also be represented by numerical valued symbols through some form of coding. For example, the calendar years starting with 1980 may be coded into symbols having values within a range of positive integers starting with zero.

In preferred embodiments, each symbol $x_i$ represents only the magnitude of numeric quantities. Additional information is required to convey whether numeric information represented by a symbol is positive or negative. Furthermore, the code words generated in response to such symbols do not distinguish between positive and negative quantities; therefore, a sign bit is included with code words representing nonzero numeric information. An example of this coding is provided in the ISO/MPEG standards document cited above.

One convenient numerical ordering of symbols is a sequence of increasing values such as, for example, a set of n symbols $x_i$ arranged in an order such that $x_1 \leq x_2 \leq \ldots x_n$. As another example, a set of three symbols could be ordered such that $x_1 \leq x_3 \leq x_2$. No particular ordering is critical to the practice of the invention.

Figure 4A:
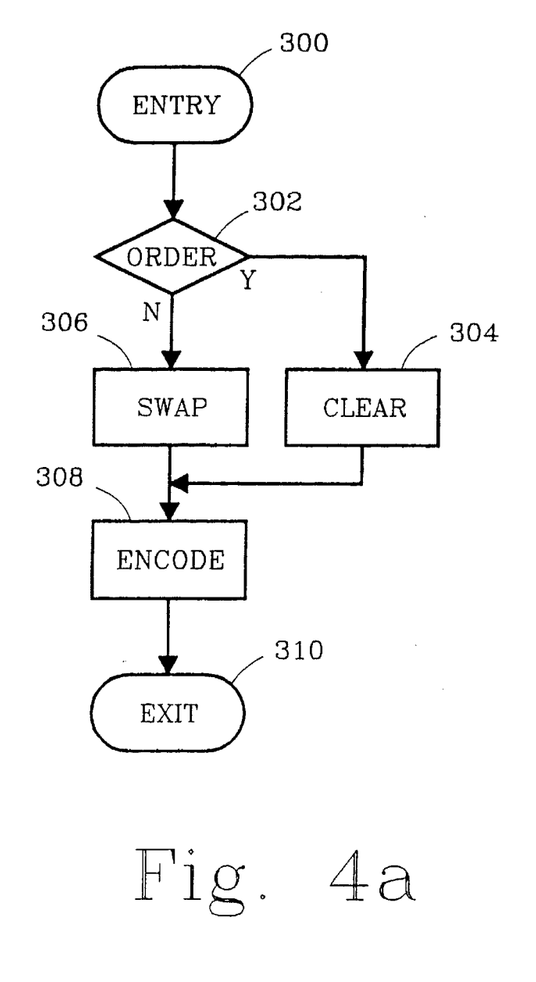
FIGS. 4a and 4b illustrate flow charts of compressing and decompressing logic in accordance with the teachings of the present invention.

FIG. 4a is a flow chart illustrating logic of one embodiment of a compressor according to the present invention for compressing pairs of symbols. ENTRY 300 receives a pair of symbols (x,y). ORDER 302 establishes whether $x \leq y$. If so, CLEAR 304 sets a "reorder flag" to zero; otherwise, SWAP 306 exchanges the values of x and y and sets the reorder flag to one. CODER 308 generates a code word in response to the properly ordered pair of symbols (x,y). EXIT 310 provides the code word and the reorder flag for subsequent processing, transmission or storage.

A substantially equivalent process is represented in the following program fragment where CW is a code word, OI is a reorder flag and TE[x,y] represents encoding using an encoding table. Note that a reordering of the symbols is accomplished by reversing the order of the arguments in line 6.

| (1) | entry[x,y] |
|---|---|
| (2) | if x $\leq$ y then |
| (3) | CW = TE[x,y] |
| (4) | OI = 0 |
| (5) | else |
| (6) | CW = TE[y,x] |
| (7) | OI = 1 |
| (8) | endif |
| (9) | exit[CW,OI] |

Figure 3B:
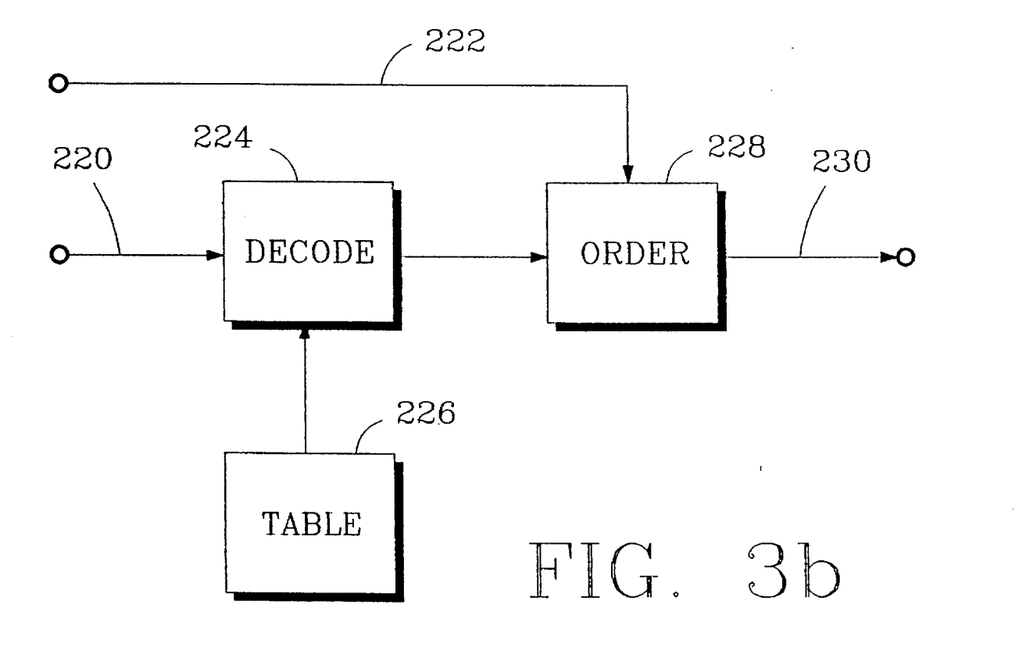

The block diagram shown in FIG. 3b provides additional detail for one embodiment of deccompressor 126. Decoder 224 consults table 226 and generates an ordered plurality of symbols in response to a code word received from path 220. Order 228 receives from path 222 an indication of "original" order, reorders the plurality of symbols as required to establish the original order and passes the properly ordered symbols along path 230.

Figure 4B:
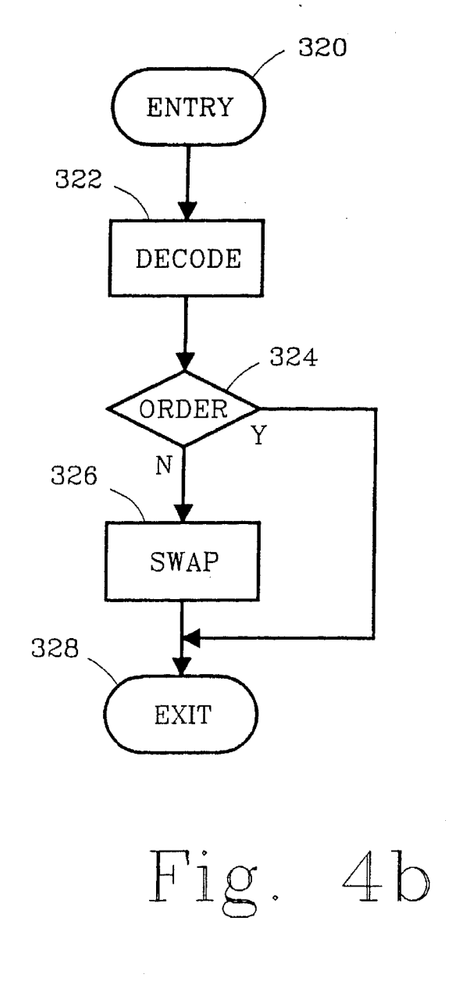

FIG. 4b is a flow chart illustrating logic of one embodiment of a decompressor according to the present invention for decompressing code words into pairs of symbols.

ENTRY 320 receives a code word and an indication of original order. DECODER 322 generates a pair of symbols (x,y) in response to the code word. ORDER 324 establishes whether the original order of the pair of symbols was such that x≦y. If not, SWAP 326 exchanges the values of x and y. EXIT 310 provides the properly ordered pair of symbols (x,y) for subsequent use.

A substantially equivalent process is represented in the following program fragment where CW is a code word, OI is an order indication and TD[CW] represents decoding using a decode table. Note that a reordering of the symbols is accomplished by reversing the order of the symbols in line 6 provided upon exit from the program fragment.

```
(1)      enty[CW,OI]
(2)      (x,y) = TD[CW]
(3)      if OI = 0 then
(4)         exit[x,y]
(5)      else
(6)         exit[y,x]
(7)      endif
```

Conventional Encoding Tables

A better appreciation of some basic concepts may be gained by considering a few embodiments of coders incorporating various aspects of the present invention. The embodiments discussed herein apply Huffman coding techniques to pairs of symbols x and y but it should be appreciated that the principles and concepts are applicable to other dimensions and to other coding techniques such as Shannon-Fano coding.

In one embodiment, Huffman coding provides data compression for any of sixteen different messages where each message is represented by a pair of symbols (x,y). The probability of occurrence for each of the messages is provided in the following matrix $P_0$.

|   | y |   |   |   |
|---|---|---|---|---|
| x | 1 | 2 | 3 | 4 |
| 1 | .07 | .05 | .03 | .02 |
| 2 | .05 | .10 | .07 | .05 |
| 3 | .03 | .07 | .15 | .07 |
| 4 | .02 | .05 | .07 | .10 |

In this example, the probability matrix is symmetric; therefore, the probability of occurrence $P_0(2,3)$ for message (2,3), which is 0.07, is equal to the probability of occurrence $P_0(3,2)$ for message (3,2).

The "entropy" of a message set is the average information content of each message in the set. The entropy is a lower bound for the average number of bits required to represent each message in the set. For any set of N messages, the entropy may be obtained from the expression $$H = \sum_{i=1}^{N} -P_i \cdot \log P_i \quad (1)$$

where $H$=entropy of the message set $\{i\}$;

$P_i$=probability of message i occurring; and log=logarithm function to the base 2.

Additional details may be obtained from Lynch, "Data Compression Techniques and Applications," 1985, pp. 1–60, and from Bell, Cleary and Witten, "Text Compression," 1990, pp. 100–107, both of which are incorporated herein by reference in their entirety.

The entropy for the message set $\{x,y\}$ represented by the probability matrix $P_0$ above is equal to entropy $H_0$ obtained from the expression $$H_0 = \sum_{x=1}^{4} \sum_{y=1}^{4} -P_{xy} \cdot \log P_{xy} = \sum_{i \in \{x,y\}} -P_i \cdot \log P_i \quad (2)$$

which is approximately 3.8114 bits.

Huffman coding or Shannon-Fano coding, for example, can be used to derive a set of variable-length binary code words for each of the sixteen messages. The following examples show how the present invention may be used with Huffman coding techniques, but similar considerations apply to other coding techniques as well.

The following matrix is an encoding table $TE_0$ which contains a set of code words varying in length from three bits for the most probable message to six bits for the least probable message.

| x | 1 | 2 | 3 | 4 |
|---|---|---|---|---|
| 1 | 0010 | 1100 | 001110 | 001100 |
| 2 | 1101 | 100 | 0100 | 1110 |
| 3 | 001111 | 0101 | 000 | 0110 |
| 4 | 001101 | 1111 | 0111 | 101 |

A process for encoding or compressing a two-symbol message can use the value of the two symbols to look up the appropriate code word from the encoding table. For example, the code word for message (2,3) is $CW=TE_0[2,3]=0100$.

The average code word length for a particular coding technique, assuming that specific messages occur with a frequency according to the probability matrix, may be obtained from the expression $$\bar{l} = \sum_{i \in \{x,y\}} P_i \cdot \text{len}(i) \quad (3)$$

where $\bar{l}$=average length of code words; and len(i)=length of code word for message i.

The average code word length for encoding table $TF_0$ is 3.85 bits which is slightly larger than the theoretical minimum or entropy. The excess indicates that there is some redundancy in the coding.

Although Huffman coding is not optimal under all circumstances, it is widely used because it is computationally efficient. Unfortunately, the encoding and decoding tables are usually very large and require considerable memory for storage. In the example above, the encoding table is modest in size because each symbol may assume one of only four values. In many practical applications, each symbol may assume any of a large number of values. It should be easily seen that an encoding table for multi-symbol messages increases as the product of the number of possible values for each symbol. A table such as table $TE_0$ above increases as the square of the number of possible symbol values for x and y.

In many embodiments of information processing systems such as that illustrated in FIG. 1, encoding tables are stored in RAM or ROM; therefore, a technique which can reduce the size of coding tables can reduce the amount of memory required, thereby reducing implementation costs.

Compact Encoding Tables

An encoder of multi-symbol messages which incorporates features of the present invention can use an encoding table which is significantly smaller than a conventional encoding table. If each symbol in a two-symbol message may assume any one of N possible values, a conventional encoding table will comprise $N^2$ elements. A compact encoding table for such two-symbol messages according to the present invention comprises only $(N^2+N)/2$ elements, which approaches one-half the size of a conventional encoding table as N becomes large.

Referring to the example discussed above, encoding table $TE_0$ comprises sixteen code words, one code word for each of the possible messages (x,y). By ensuring that symbol x is always less than or equal to symbol y, or $x \leq y$, six messages are eliminated from the message set $\{x,y\}$, thereby reducing the size of the encoding table. This numerical relation can be ensured by reordering the x and y symbols as necessary before coding. The effects of the reordering can be reversed by a counterpart decoder in response to information regarding the original order of the symbols. This order information can be conveyed by a single bit.

For example, in one embodiment, an encoder reorders a symbol pair as necessary, generates a code word for the ordered pair, and generates order information only if $x \pm y$. The order information is conveyed by a single bit which is equal to one if the symbols were originally not in order and is equal to zero if the symbols were originally in order.

The reordering of symbols when $x > y$ effectively doubles the probability of occurrence for each message (x,y) where $x \pm y$. This change is reflected in the following probability matrix $P_1$.

|   |     | y   |     |     |
|---|-----|-----|-----|-----|
| x | 1   | 2   | 3   | 4   |
| 1 | .07 | .10 | .06 | .04 |
| 2 | —   | .10 | .14 | .10 |
| 3 | —   | —   | .15 | .14 |
| 4 | —   | —   | —   | .10 |

The following encoding table $TE_1$ comprises code words for this revised message set which vary in length from three to four bits.

|   |      | y   |      |      |
|---|------|-----|------|------|
| x | 1    | 2   | 3    | 4    |
| 1 | 1001 | 011 | 0000 | 0001 |
| 2 | —    | 001 | 110  | 1000 |
| 3 | —    | —   | 101  | 111  |
| 4 | —    | —   | —    | 010  |

From expressions 2 and 3 above, taking into account that the probability of some messages in the set $\{x,y\}$ are now zero, the entropy of the revised message set is found to be approximately 3.2314 bits and the average code word length for table $TE_1$ is 3.27 bits. This decrease is offset by any additional bits required to convey order information to a decoder.

No penalty in compression performance is incurred in exchange for the reductions in coding table size because the number of bits required to convey order information is offset by an equal reduction in message entropy. This may be shown by calculating the expression $$\bar{l}_{OI} + \Delta H \quad (4)$$

where $\bar{l}_{OI}$=average number of bits required to convey order information; and $\Delta H$=change in entropy for the modified message set.

As mentioned above, the order information for two-symbol messages can be conveyed by one bit and need be sent only when $x \pm y$. This average length may be calculated from the expression $$\bar{l}_{OI} = \sum_{i \in \{x,y\}} P_i \cdot \text{len}(OI_i) = \sum_{i \in A} P_i + \sum_{i \in B} P_i = P_A + P_B \quad (5)$$

where

A=set of messages for $x<y$;

B=set of messages for $x>y$;

$P_A$=cumulative probability of all messages in set A; and $P_B$=cumulative probability of all messages in set B.

The probability matrix $P_0$ is symmetric; therefore, $P_A=P_b$ and $$\bar{l}_{OI} = P_A + P_B = 2P_A. \quad (6)$$

The change in entropy can be easily calculated from the elements off the main diagonal of probability matrix $P_0$. This can be seen by first recognizing that the entropy $H_0$ of the original message set is $$\begin{aligned} H_0 &= \sum_{i \in \{x,y\}} -P_i \cdot \log P_i = \sum_{i \in A} -P_i \cdot \log P_i + \\ &\quad \sum_{i \in I} -P_i \cdot \log P_i + \sum_{i \in B} -P_i \cdot \log P_i \\ &= H_A + H_I + H_B \end{aligned} \quad (7)$$

where

I=set of messages for x=y;

$H_A$=entropy for set A;

$H_I$=entropy for set I; and $H_B$= entropy for set B.

The entropy $H_1$ of the revised message set corresponding to probability matrix $P_1$ is $$\begin{aligned} H_I &= \sum_{i \in A} -2P_i \cdot \log 2P_i + \sum_{i \in I} -P_i \cdot \log P_i \\ &= 2 \sum_{i \in A} -P_i \cdot (1 + \log P_i) + \sum_{i \in I} -P_i \cdot \log P_i \\ &= 2 \sum_{i \in A} -P_i + 2 \sum_{i \in A} -P_i \cdot \log P_i + \sum_{i \in I} -P_i \cdot \log P_i \\ &= -2P_A + 2H_A + H_I \end{aligned} \quad (8)$$

The probability matrix $P_0$ is symmetric; therefore, $$H_A = H_B, \quad (9a)$$

$$H_0 = H_A + H_I + H_B = H_I + 2H_A, \quad (9b)$$

$$H_1 = -2P_A + 2H_A + H_I = -2P_A + H_0, \text{ and} \quad (9c)$$

$$\Delta H = H_1 - H_0 = -2P_A. \quad (9d)$$

Therefore, $$\bar{l}_{OI} + \Delta H = 2P_A + (-2P_A) = 0. \quad (10)$$

The number of additional bits required to convey the order information is exactly offset by the decrease in entropy; hence, no compression penalty is incurred.

Conventional Decoding Tables

Figures 5A, 5B:
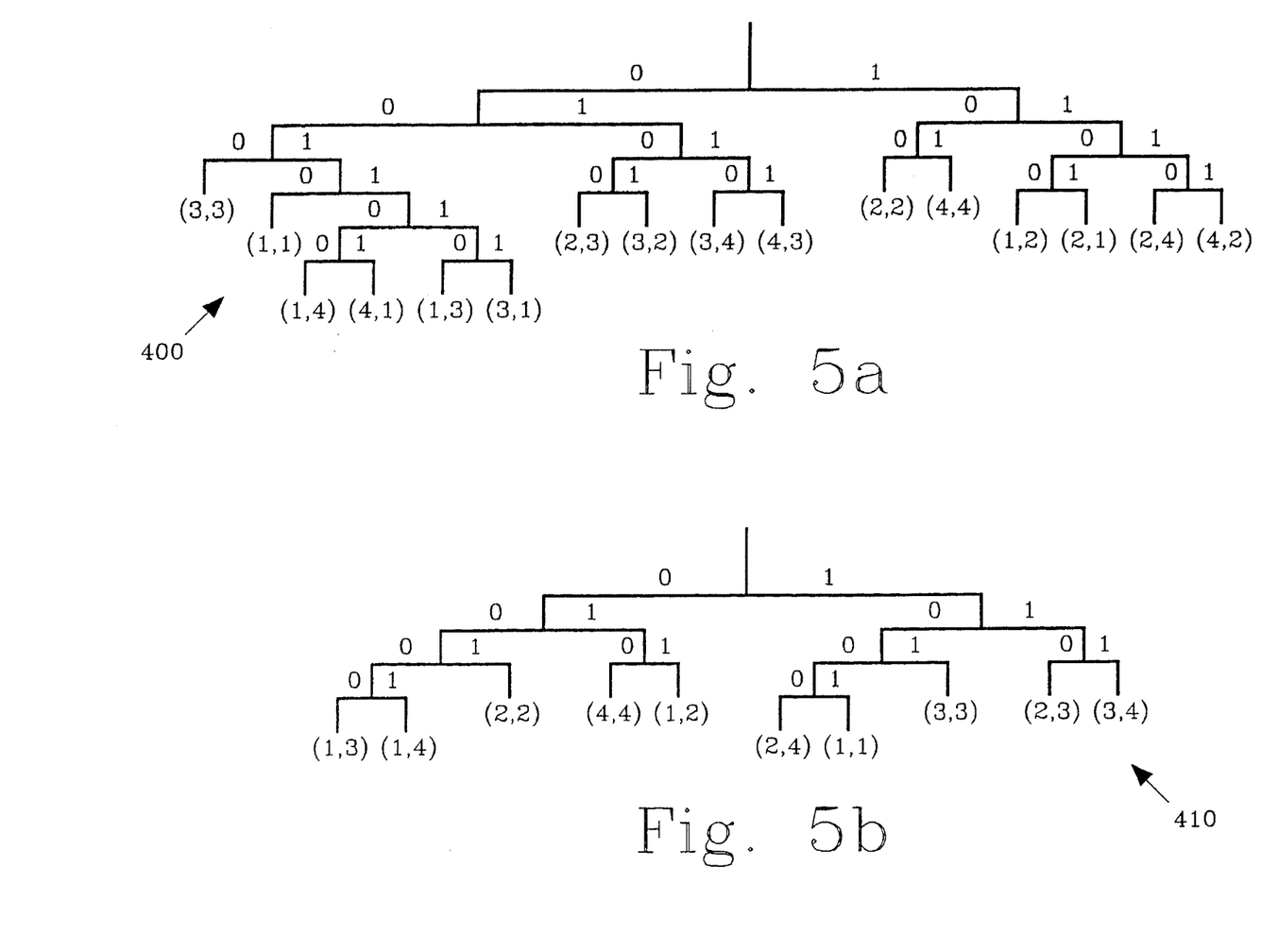
FIGS. 5a and 5b illustrate binary tree decoding structures.

FIG. 5a illustrates a decoding structure in the form of binary tree 400. The particular tree illustrated corresponds to the encoding table $TE_0$ discussed above. Each node in the tree either has two branches each connected to another node, or is a "leaf" node having no branches and representing a specific message. By starting at a "root" node at the "trunk"

of the tree and traversing branches in accordance with values of successive bits in a code word, ultimately the proper leaf node is reached which provides the message represented by the code word. In the example shown, a left-hand branch is traversed in response to a "0" bit and a right-hand branch is traversed in response to a "1" bit.

For example, traversal of tree 400 for the code word "1101" starts at the root node, proceeds along the fight-hand branch to a first node in response to the first bit ("1"), proceeds along the right-hand branch to a second node in response to the second bit ("1"), proceeds along the left-hand branch to a third node in response to the third bit ("0"), and then proceeds along the right-hand branch to a leaf node in response to the fourth bit ("1"). The leaf node indicates that the corresponding message is (2,1). Referring to the $TE_0$ encoding table shown above, it may be seen that this is the proper result.

In one embodiment, the tree is implemented using a linked-list structure. Blocks of memory representing tree nodes contain two links pointing to other node blocks. Blocks of memory representing leaf nodes may either store the message itself or may contain a link pointing to where the message is stored. The amount of memory required to store a tree generally increases as the number of nodes in the tree increases. Generally, the amount of memory is roughly proportional to the number of nodes and to the number of messages. In the example shown, the tree comprises fifteen nodes and sixteen messages.

Compact Decoding Tables

A decoder of multi-symbol messages which incorporates features of the present invention can use a decoding table which is significantly smaller than a conventional decoding table. FIG. 5b illustrates a decoding structure in the form of binary tree 410 which corresponds to the encoding table $TE_1$ discussed above. In contrast to tree 400, tree 410 comprises only nine nodes and ten messages. A compact tree may be traversed in the same manner as explained above for a conventional tree but an additional step may be required to properly decode a code word.

For example, referring to FIG. 5b, the code word "011" corresponds to the message (1,2); however, the encoder using the $TE_1$ encoding table may have reordered the symbols. By consulting the order information passed in the coded signal with the code word, a decoder can establish the proper message. In one embodiment, the proper message is (1,2) if the order information is a "0" bit and is (2,1) if the order information is a "1" bit.

As another example, the code word "010" corresponds to the message (4,4). The decoder does not require any order information to establish that this is the proper message.

Decoding tables may implemented in other ways. For example, a decoding table may contain entries representing all possible code words and decoding comprises matching a code word with an entry and fetching the corresponding message.

It should be appreciated that the present invention is not restricted to any particular implementation of encoding and decoding tables. The embodiments discussed herein are offered only as examples.

Higher Dimensional Coding

As mentioned above, the present invention may also be applied to higher orders of multi-dimensional coding. For messages $(x_1, x_2, \ldots x_n)$ comprising n symbols, n-dimensional coding may be used. If each of the n symbols may assume any of N different values, then the probability matrix and conventional encoding table each comprise $N^n$ entries. It is easy to see that the size of encoding and decoding tables increases dramatically with increasing dimensions. The examples discussed below all assume that each symbol in a message may assume any of N different values.

A group of n symbols may be arranged in n factorial (n!) different ways. This means that as many as n! different messages may be represented by various permutations of n symbols. By ensuring that the symbols are arranged according to only one of these permutations, the encoding matrix may be reduced to a size of approximately $N^n / n!$ entries.

Figure 6A:
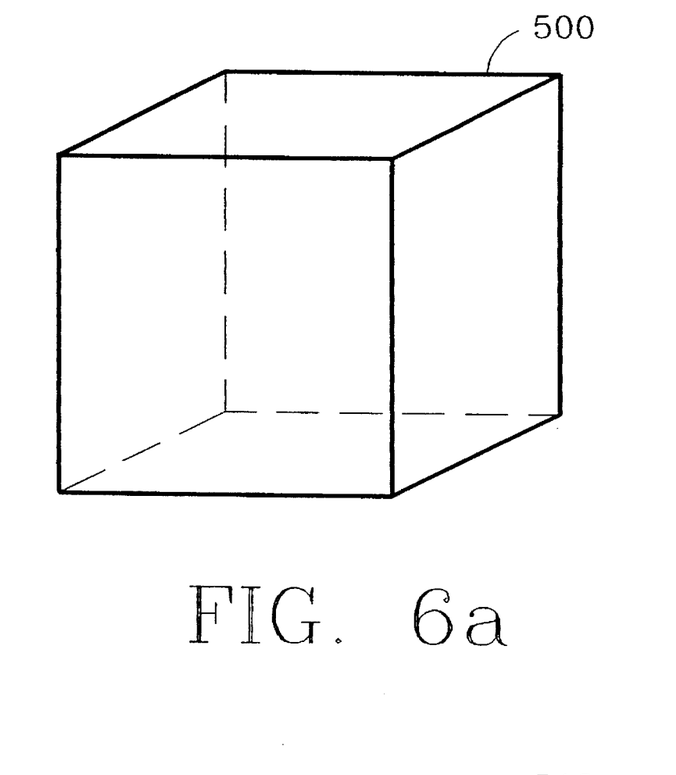
FIGS. 6a and 6b are graphical illustrations of a conceptual view of coding tables for three-dimensional coding.
Figure 6B:
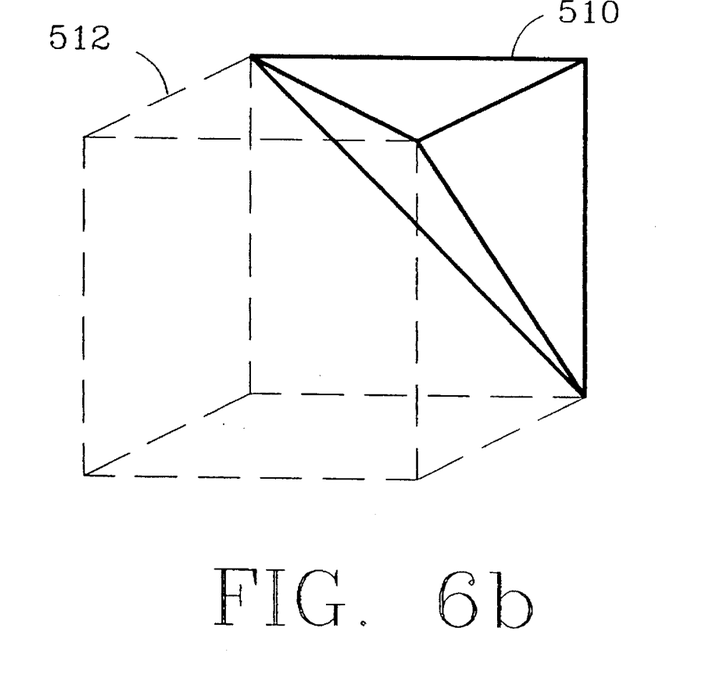

In three-dimensional coding, for example, messages comprise three symbols (x,y,z). A conventional encoding table for the message set {x,y,z} comprises $N^3$ entries and, as illustrated in FIG. 6a, may be visualized in 3-space as cube 500 of length N along each edge. A compact encoding table according to the present invention comprises only $(N^3+3N^2+2N) / 6$ entries and, as illustrated in FIG. 6b, may visualized in 3-space as tetrahedron 510 with a base in the shape of an equilateral triangle and a vertex opposite the base at the intersection of three mutually orthogonal edges of length N. In effect, tetrahedron 510 is the result of slicing off a corner of cube 512. As N becomes large, the number of entries in the compact encoding table approaches $N^3 / 6$.

In principle, there is no coding penalty incurred by using a compact table; however, in particular embodiments, a slight penalty may be incurred due to redundancy in the order information. This redundancy will require more bits to convey order information than is saved by decreases in message set entropy. In three-dimensional coding for example, order information must convey any one of six possible orders. A coding scheme using three bits to convey the six possible orders is simple to implement but is redundant. If each of the six orders are equally probable, order information only requires approximately 2.585 (or $\log_2 6$) bits. The 3-bit scheme wastes approximately 0.415 bits per code word; however, this inefficient scheme may be attractive because it can be balanced against an approximate 80 percent decrease in coding table size.

I claim:

1. An encoding method for encoding a plurality of symbols representing a signal intended for human perception, said method comprising generating order information representing the order of symbols within said plurality of symbols with respect to a specific order, generating a code word in response to said plurality of symbols such that said symbols, ordered according to said specific order, can be recovered from said code word, and assembling said code word and said order information into a form suitable for processing, transmission or storage.

2. An encoding method according to claim 1 wherein said specific order is based upon relative numerical values corresponding to said symbols.

3. An encoding method according to claim 1 wherein said plurality of symbols is a pair of symbols x and y, and wherein said order information indicates whether said pair of symbols are ordered according to a specific numerical relation of values corresponding to said pair of symbols, said specific numerical relation chosen from the set of relations $x<y$, $x \leq y$, $x>y$ and $x \geq y$.

4. An encoding method according to claim 1 wherein said code word is generated in response to an encoding table comprising table entries, wherein said table entries represent code words for only various plurality of symbols in which symbols are ordered according to said specific order.

5. An encoding method according to any one of claims 1 through 4 wherein said code word has a length which varies inversely to likelihood of occurrence of said plurality of symbols ordered according to said specific order.

6. An encoding method according to claim 5 wherein said code word is generated according to either Huffman encoding or Shannon-Fano encoding techniques.

7. A decoding method for decoding a coded signal prepared in response to a plurality of symbols representing a signal intended for human perception, said method comprising extracting from said coded signal a code word and order information representing the order of symbols within said plurality of symbols with respect to a specific order, generating an interim set of symbols by decoding said code word, and recovering said plurality of symbols by ordering the symbols within said interim set of symbols according to said order information.

8. A decoding method according to claim 7 wherein said interim set of symbols comprises a pair of symbols and wherein said order information indicates whether or not symbols within said plurality of symbols are ordered according to said specific order.

9. A decoding method according to claim 7 wherein said interim set of symbols is generated in response to a decoding table comprising table entries, wherein said table entries represent only interim sets of symbols in which symbols are ordered according to said specific order.

10. A decoding method according to any one of claims 7 through 9 wherein said code word has a length which varies inversely to likelihood of occurrence of said plurality of symbols ordered according to said specific order.

11. A decoding method according to claim 10 wherein said decoding is performed according to either Huffman decoding or Shannon-Fano decoding techniques.

12. An encoder for encoding a plurality of symbols representing a signal intended for human perception, said encoder comprising order means for generating order information representing the order of symbols within said plurality of symbols with respect to a specific order, coding means for generating a code word in response to said plurality of symbols such that said symbols, ordered according to said specific order, can be recovered from said code word, and formatting means for assembling said code word and said order information into a form suitable for processing, transmission or storage.

13. An encoder according to claim 12 wherein said specific order is based upon relative numerical values corresponding to said symbols.

14. An encoder according to claim 12 wherein said plurality of symbols is a pair of symbols x and y, and wherein said order means generates order information indicating whether said pair of symbols are ordered according to a specific numerical relation of values corresponding to said pair of symbols, said specific numerical relation chosen from the set of relations $x<y$, $x \leq y$, $x>y$ and $x \leq y$.

15. An encoder according to claim 12 wherein said coding means comprises RAM and/or ROM storing one or more encoding tables comprising table entries, and wherein said coding means generates said code word in response to said one or more encoding tables, wherein said table entries represent code words for only various plurality of symbols in which symbols are ordered according to said specific order.

16. An encoder according to any one of claims 12 through 15 wherein said coding means generates said code word having a length which varies inversely to likelihood of occurrence of said plurality of symbols ordered according to said specific order.

17. An encoder according to claim 16 wherein said coding means generates said code word according to either Huffman encoding or Shannon-Fano encoding techniques.

18. A decoder for decoding a coded signal prepared in response to a plurality of symbols representing a signal intended for human perception, said decoder comprising deformatting means for extracting from said coded signal a code word and order information representing the order of symbols within said plurality of symbols with respect to a specific order, decoding means for generating an interim set of symbols by decoding said code word, and order means for recovering said plurality of symbols by ordering the symbols within said interim set of symbols according to said order information.

19. A decoder according to claim 18 wherein said interim set of symbols comprises a pair of symbols and wherein said order information indicates whether or not symbols within said plurality of symbols are ordered according to said specific order.

20. A decoder according to claim 18 wherein said decoding means comprises RAM and/or ROM storing one or more decoding tables comprising table entries, and wherein said decoding means generates said interim set of symbols in response to said decoding tables, wherein said table entries represent only interim sets of symbols in which symbols are ordered according to said specific order.

21. A decoder according to any one of claims 18 through 20 wherein said coding means generates said code word having a length which varies inversely to likelihood of occurrence of said plurality of symbols ordered according to said specific order.

22. A decoder according to claim 21 wherein said decoding means decodes said code word according to either Huffman decoding or Shannon-Fano decoding techniques.

* * * * *